(12) United States Patent
Ishibe

(10) Patent No.: US 7,800,716 B2
(45) Date of Patent: Sep. 21, 2010

(54) SOLID-STATE IMAGE CAPTURING DEVICE, MANUFACTURING METHOD FOR THE SOLID-STATE IMAGE CAPTURING DEVICE, COLOR FILTER AND FORMING METHOD FOR THE COLOR FILTER, LIQUID CRYSTAL DISPLAY APPARATUS, AND ELECTRONIC INFORMATION DEVICE

(75) Inventor: Shouichi Ishibe, Hiroshima (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 146 days.

(21) Appl. No.: 12/216,286

(22) Filed: Jul. 2, 2008

(65) Prior Publication Data

US 2009/0015767 A1    Jan. 15, 2009

(30) Foreign Application Priority Data

Jul. 3, 2007    (JP)    ............... 2007-175649

(51) Int. Cl.
*G02F 1/1335*    (2006.01)
*H01L 31/0232*    (2006.01)
*H01L 31/18*    (2006.01)
*G02B 5/22*    (2006.01)
*B05D 5/06*    (2006.01)

(52) U.S. Cl. ............... 349/106; 349/187; 257/432; 257/E31.127; 438/30; 438/70; 359/891; 427/162

(58) Field of Classification Search ............ 349/187, 349/191, 158, 129, 104, 106, 107, 108, 97; 257/432, E31.127; 359/891; 438/70, 30; 427/162
See application file for complete search history.

(56) References Cited

U.S. PATENT DOCUMENTS

| 6,166,800 | A  | * | 12/2000 | Silverstein et al. .......... 349/201 |
| 6,783,900 | B2 | * | 8/2004  | Venkataraman ............... 430/7 |
| 7,070,701 | B2 | * | 7/2006  | Takagi et al. ................. 216/41 |
| 7,675,024 | B2 | * | 3/2010  | Lenchenkov ............... 250/226 |
| 2005/0045980 | A1 | * | 3/2005 | Guidash ..................... 257/432 |
| 2007/0298164 | A1 | * | 12/2007 | Ogata et al. ................. 427/162 |
| 2008/0068476 | A1 | * | 3/2008 | Yun ......................... 348/280 |
| 2009/0015767 | A1 | * | 1/2009 | Ishibe ....................... 349/106 |

FOREIGN PATENT DOCUMENTS

| JP | 2003-215321 | 7/2003 |
| JP | 2005-123225 | 5/2005 |
| JP | 2005-202252 | 7/2005 |
| JP | 2005-274967 | 10/2005 |

* cited by examiner

*Primary Examiner*—Brian M Healy
(74) *Attorney, Agent, or Firm*—Edwards Angell Palmer & Dodge LLP

(57) ABSTRACT

A manufacturing method for a solid-state image capturing device includes a color filter patterning step of patterning the color filters in such a manner that a predetermined interval is formed between adjacent color filter materials of different colors; and a color filter forming step of heat treating and fluidizing the patterned color filter materials and further curing the color filter materials to form color filters of different colors.

27 Claims, 11 Drawing Sheets

US 7,800,716 B2

SOLID-STATE IMAGE CAPTURING DEVICE, MANUFACTURING METHOD FOR THE SOLID-STATE IMAGE CAPTURING DEVICE, COLOR FILTER AND FORMING METHOD FOR THE COLOR FILTER, LIQUID CRYSTAL DISPLAY APPARATUS, AND ELECTRONIC INFORMATION DEVICE

This Nonprovisional application claims priority under 35 U.S.C. §119(a) on Patent Application No. 2007-175649 filed in Japan on Jul. 3, 2007, the entire contents of which are hereby incorporated by reference.

BACKGROUND OF THE INVENTION

1. Field of the Invention

The present invention relates to a solid-state image capturing device having a color filter provided above each light receiving section provided on a surface of a semiconductor substrate, and configured with semiconductor elements for performing photoelectric conversion on image light from a subject to capture the image light; a manufacturing method for the solid-state image capturing device; a color filter; a forming method for the color filter; a liquid crystal display apparatus using the color filter; and an electronic information device, such as a digital camera (e.g., digital video camera and digital still camera), an image input camera, a scanner, a facsimile machine and a camera-equipped cell phone device, having the solid-state image capturing device, which is manufactured by the manufacturing method of the solid-state image capturing device, as an image input device in an image capturing section of the electronic information device, or an electronic information device having the liquid crystal display apparatus as a display section.

2. Description of the Related Art

Conventionally, it is known that a solid-state image capturing device capable of capturing a color image has a structure where color filters for optically separating incident light are provided above the respective corresponding light receiving sections provided on a surface of a semiconductor substrate.

A specific structure of a solid-state image capturing device having such color filters will be explained in detail with reference to FIG. 8.

FIG. 8 is a longitudinal cross sectional view showing an exemplary essential structure of a conventional solid-state image capturing device.

In FIG. 8, a conventional solid-state image capturing device 100 has a plurality of light receiving sections 102 for performing photoelectric conversion on incident light, formed in a matrix on a surface layer of a semiconductor substrate 101. On a semiconductor substrate 101, gate film 103 composed of polysilicon is formed adjacent to the light receiving section 102 so as to read out and transfer photoelectrically converted signal charges by each light receiving section 102. Further, on a substrate area other than each light receiving section 102, that is, on the gate film 103, for example, a shading film 104 is formed via interlayer insulation film, so that light will not enter. The shading film 104 is opened above each light receiving section 102. An interlayer insulation film 105a is formed on the semiconductor substrate 101, in which the light receiving sections 102 are formed, and the shading film 104 for the purpose of electric insulation.

Further, on the interlayer insulation film 105a, an interlayer insulation film 105b is formed on the interlayer insulation film 105a, so that the unevenness resulted from the shape of a base of the interlayer insulation film 105a is improved and color filters can be formed on the resultant flat surface. The interlayer insulation film 105b is composed of a transparent acrylic material and the like in order to improve adhesiveness to the color filters and improve optical transmittance.

On the interlayer insulation film 105b, a plurality of color filters 106a, 106b and 106c are arranged and formed in a corresponding manner to respective light receiving sections 102. Desirably, the color filters 106a, 106b and 106c are formed checkerwise in order as shown in FIG. 9, for example.

FIG. 9 is a plan view hypothetically showing a desirable formation of color filters shown together with light receiving sections 102. A-A' in FIG. 9 corresponds to the left side of FIG. 8, and B-B' in FIG. 9 corresponds to the right side of the FIG. 8.

On the color filters 106a, 106b and 106c, an interlayer insulation film 105c is formed for the purpose of protecting the color filters 106a, 106b and 106c and planarizing the base surface of microlenses 107 before forming the microlenses 107. On the interlayer insulation film 105c, microlenses 107 are formed in a corresponding manner to respective light receiving section 102 for the purpose of refracting incident light and condensing light that enters towards the shading film 104, which forms ineffective areas, into the light receiving section 102. Due to the microlenses 107, the amount of light that enters the light receiving sections 102 increases, improving the light receiving sensitivity.

Conventionally, the formation of the color filters 106a, 106b and 106c are performed as follows.

First, a photosensitive color filter material (material for the color filter 106a) is applied on the interlayer insulation film 105a up to a desired thickness by a spin coating method and the like. The applied color filter material is exposed by an exposing device so that a pattern will be left only in desired areas among areas corresponding to the positions of respective light receiving sections 102. A process using a developing solution is performed to pattern the color filter 106a.

Next, a photosensitive color filter material (material for the color filter 106b) is applied on the interlayer insulation film 105a up to a desired thickness by a spin coating method and the like. The applied color filter material is exposed by an exposing device so that a pattern will be left only on another desired areas among areas corresponding to the positions of respective light receiving sections 102. A process using a developing solution is performed to pattern the color filter 106b. Similarly, a color filter 106c is further patterned on areas that remain after the formation of the color filters 106a and 106b among areas corresponding to the positions of respective light receiving sections 102.

A photosensitive material, including a pigment and a dye, is used as a color filter material, and desired color filters 106a, 106b and 106c are formed on desired light receiving sections 102 using a photolithography technique. The color filters 106a, 106b and 106c have a plurality of colors. In the case of FIG. 8, the color filters 106a, 106b and 106c are formed as a green color filter (G; green color), a blue color filter (B; blue color) and a red color filter (R; red color) respectively.

At this point, owing to the resolutions of the color filters 106a, 106b and 106c, corner portions (edge portion) of rectangular color filters 106a, 106b and 106c have blunt edges as shown in FIG. 10. Further, due to the alignment accuracy during the patterning, a gap (interval C) as shown in FIG. 10 or an overlapping portion D at the upper and lower end portions as shown in FIG. 8 is formed between adjacent color filters 106a, 106b and 106c.

Reference 1, for example, proposes a method for forming a color filter that forms a color filter using a dye containing negative type curing composite that enables an excellent rectangular pattern formation. According to such a conventional method for forming a color filter, it is said that a color filter having an excellent rectangular pattern formation (accurate rectangle color filter having edges) can be formed with good cost-effectiveness.

Further, Reference 2, for example, proposes a method for forming a color filter, in which a newly developed photopolymerization initiator is mixed with a photosensitive colored composite for color filters. According to such a method for forming a color filter, it is said that the sensitivity of the photosensitive colored composite is significantly increased, so that sufficient curing with a small amount of exposure is possible, and further that an accurate pattern can be formed because the photosensitive colored composite has an excellent pattern forming capability.

Further, Reference 3, for example, proposes a method for forming a color filter, in which a color filter forming area in a base interlayer insulation film is processed in a concave form, and an edge portion of the color filter is formed into a thin film. According to such a method for forming a color filter, it is said that the color filter in a thin film form has an excellent pattern forming capability, so that an accurate pattern can be formed.

Further, Reference 4, for example, proposes a method for forming a color filter, in which a red alignment mark is formed concurrently with the formation of red color filters of all the color filters, and an alignment is performed with a red color alignment light by the red alignment mark to pattern a blue resist material concurrently with the formation of blue filters of all the color filters. According to such a method for forming a color filter, it is said that high contrast can be obtained at the formation of the blue filter due to the red alignment mark that does not absorb the red alignment light, so that the alignment accuracy of the lithography technique can be improved and an accurate color filter processing can be achieved.

Reference 1: Japanese Laid-Open Publication No. 2005-274967

Reference 2: Japanese Laid-Open Publication No. 2005-202252

Reference 3: Japanese Laid-Open Publication No. 2005-123225

Reference 4: Japanese Laid-Open Publication No. 2003-215321

SUMMARY OF THE INVENTION

The conventional techniques described above, however, have the following problems.

As described above, the color filter material includes a pigment or a dye. Consequently, the resolution of the color filter is not as good as that of a resist used for a manufacturing process of a common semiconductor apparatus. For this reason, the rectangular formation collapses at the corner portion (edge portion) of a rectangle pattern of the color filters 106a, 106b and 106c, resulting in the gap C in between the adjacent color filters 106a, 106b and 106c. If the gap C exists, white light, which passes through the gap C and does not pass through the color filters 106a, 106b and 106c, enters. The white light then reflects multiply inside the interlayer insulation films 105a and 105b, or enters directly above the light receiving section 102. As a result, the color reproducibility deteriorates upon capturing an image and the color turns weak, causing inferiority that is too white. As discussed, if the gap C exists, in between the color filters 106a, 106b and 106c, optical transmittance of the color filters 106a, 106b and 106c substantially increases, deteriorating the light separation characteristics of the device.

In order to minimize the gap C, References 1 to 4 described above try to improve the color filter material to improve the resolution and light receiving sensitivity and control the collapsing of the formation, so that the gap C described above can be reduced. Further, References 1 to 4 try to improve the base pattern to improve the process accuracy, and try to improve the alignment accuracy to limit the gap C.

However, one cell size including one light receiving section 102 is reduced with the achievement of the high pixel density and the miniaturization of chips. Even the resolution is improved by introducing a micromachining technique, such improvement on the resolution by the micromachining technique will be insufficient by the reducing of cell size, resulting in a relatively constant gap size. Therefore, the deteriorating of the light separation characteristics of the device always occurs. Similarly, with regard to the improvement on the processing accuracy of the base and the improvement on the alignment accuracy, such improvement effect is canceled out due to the reducing of the cell size.

On the other hand, even if a mask pattern is contrived in a lithography technique so that the color filter becomes extremely closer to a rectangle shape after patterning, an overlapping portion D of the adjacent color filters 106a, 106b and 106c is caused as shown in FIG. 8 owing to a limit on the alignment accuracy. If light condensed by the microlens 107 passes through an area with the overlapping portion D, desirable separation of colors into single colors of the respective color filters 106a, 106b and 106c cannot be performed, resulting in mixed color characteristics and therefore deterioration in light separation characteristics of the device. Moreover, the difference in the filter thickness of the color filter layers owing to the overlapping portion D of the adjacent color filters 106a, 106b and 106c deteriorates the evenness of the interlayer insulation film 105c. This affects the formation of the microlens 107 above, changing the condensing amount of light into the light receiving section 102 and making the resultant image uneven.

The present invention is intended to solve the conventional problems described above. The objective of the present invention is to provide a manufacturing method of a solid-state image capturing device. The manufacturing method enables to manufacture a solid-state image capturing device having good light separation characteristics, without having to improving the resolution of the color filter material or the characteristics of the light receiving sensitivity, without processing the base film of the color filter, by eliminating the gap in between the adjacent color filters, and by forming a color filter without causing the overlapping of adjacent color filters making the best of the limit of the alignment accuracy. The objective of the present invention is to further provide a solid-state image capturing device made by the manufacturing method according to the present invention; a color filter; a forming method for the color filter; a liquid crystal display apparatus having the color filter; and an electronic information device having the solid-state image capturing device used in an image capturing section or an electronic information device having the liquid crystal display apparatus as a display section.

A manufacturing method for a solid-state image capturing device having a plurality of light receiving sections for performing photoelectric conversion on incident light, provided on a surface side of a semiconductor substrate; and color filters of different colors for optically separating the incident light, provided above the plurality of corresponding light receiving sections according to the present invention includes: a color filter patterning step of patterning the color filters in such a manner that a predetermined interval is formed between adjacent color filter materials of different colors; and a color filter forming step of heat treating and fluidizing the patterned color filter materials and further curing the color filter materials to form color filters of different colors, thereby achieving the objective described above.

Preferably, in a manufacturing method for a solid-state image capturing device according to the present invention, the color filter material is melted by the heat treating and is widened by gravity along a substrate plane direction so as to fill the predetermined interval with the color filter materials.

Still preferably, in a manufacturing method for a solid-state image capturing device according to the present invention, the color filter forming step performs the heat treating either individually for each color after patterning the color filter materials, or simultaneously for a plurality of colors after successively patterning the plurality of color filter materials of different colors, or simultaneously for two colors of the plurality of the colors.

Still preferably, in a manufacturing method for a solid-state image capturing device according to the present invention, when the heat treating is performed individually for the each color, the color filter material is melted and widened up to a predetermined color filter area and the predetermined interval between the color filter material and an adjacent color filter material is completely filled.

Still preferably, in a manufacturing method for a solid-state image capturing device according to the present invention, when the heat treating is performed either simultaneously for the plurality of colors or simultaneously for two colors of the plurality of colors, the color filter materials of the plurality of colors or the two colors are simultaneously melted by the heat treating, and the color filter area is widened until the predetermined interval is completely filled with the color filter materials.

Still preferably, in a manufacturing method for a solid-state image capturing device according to the present invention, the heat treating is performed at between 150 degrees Celsius and 165 degrees Celsius for two to five minutes.

Still preferably, in a manufacturing method for a solid-state image capturing device according to the present invention, polystyrene resin added with a pigment or dye is used for one or more of the color filter materials.

Still preferably, in a manufacturing method for a solid-state image capturing device according to the present invention, the polystyrene resin includes a resist material including greater than or equal to 1 wt percent and less than or equal to 10 wt percent of polyhydroxy styrene.

Still preferably, in a manufacturing method for a solid-state image capturing device according to the present invention, greater than or equal to 1.5 wt percent and less than or equal to 3.5 wt percent of an yellow pigment and greater than or equal to 6.0 wt percent and less than or equal to 8.0 wt percent of a green pigment mixed with each other is used as the pigment and a material including the pigment is used for a green color filter; a material including greater than or equal to 5.0 wt percent and less than or equal to 10.0 wt percent of a red pigment is used for a red color filter; and greater than or equal to 4.0 wt percent and less than or equal to 8.0 wt percent of copper phthalocyanine blue having $\alpha$, $\beta$, or $\epsilon$ crystalline form is used as the pigment, and a material including the pigment is used for a blue color filter.

Still preferably, in a manufacturing method for a solid-state image capturing device according to the present invention, a heat bridge agent for curing is added to the color filter material.

Still preferably, in a manufacturing method for a solid-state image capturing device according to the present invention, both of epoxy compounds and melanin resin are added as the heat bridge agent to the color filter material.

Still preferably, in a manufacturing method for a solid-state image capturing device according to the present invention, greater than or equal to 0.1 wt percent or and less than or equal to 2.0 wt percent of either the epoxy compounds or the melanin resin is added as the heat bridge agent.

Still preferably, in a manufacturing method for a solid-state image capturing device according to the present invention, in the color filter patterning step, the predetermined interval is set so that there will be no gap after melting, due to the characteristic of the color filter materials and the melting amount of the color filter materials at the time of heat treating.

Still preferably, in a manufacturing method for a solid-state image capturing device according to the present invention, in the color filter patterning step, the predetermined interval is set so that adjacent color filter materials will not over lap with each other by setting the amount of the position shifting due to the alignment accuracy to the limit value.

Still preferably, in a manufacturing method for a solid-state image capturing device according to the present invention, the predetermined interval is set greater than or equal to 0.1 µm and less than or equal to 0.2 µm in the color filter patterning step.

Still preferably, in a manufacturing method for a solid-state image capturing device according to the present invention, the color filter patterning step includes: a first color filter patterning step of applying a desired thickness of a photosensitive first color filter material on an interlayer insulation film provided on the semiconductor substrate, exposing the first color filter material by an exposing device so that a pattern will be left only on a desired area among areas corresponding to the plurality of light receiving sections, and performing a process using a developing solution on the first color filter material to pattern a first color filter; a second color filter patterning step of applying a desired thickness of a photosensitive second color filter material on the interlayer insulation film, exposing the second color filter material by the exposing device so that a pattern will be left on another desired area different from the desired area among areas corresponding to the plurality of light receiving sections, and performing a process using a developing solution on the second color filter material to pattern a second color filter; and a third color filter patterning step of applying a desired thickness of a photosensitive third color filter material on the interlayer insulation film, exposing the third color filter material by the exposing device so that a pattern will be left on the rest of the area among areas corresponding to the plurality of light receiving sections, and performing a process using a developing solution on the third color filter material to pattern a third color filter.

Still preferably, in a manufacturing method for a solid-state image capturing device according to the present invention, the first color filter is a green color filter, the second color filter is either a red or blue color filter, and the third color filter is the other color of the red or blue color filter.

Still preferably, in a manufacturing method for a solid-state image capturing device according to the present invention, the color filters of different colors have either three primary colors of green, red and blue or four colors using complementary colors of yellow, magenta and cyan, and green.

Still preferably, in a manufacturing method for a solid-state image capturing device according to the present invention, the color filters of different colors form Bayer array.

A solid-state image capturing device manufactured by the manufacturing method of the solid-state image capturing device according to the present invention includes a plurality of light receiving sections for performing photoelectric conversion on incident light, provided on a surface side of a semiconductor substrate; and color filters of different colors for optically separating the incident light, provided above the plurality of corresponding light receiving sections, in which the color filters of different colors are formed in such a manner that there is no gap in between adjacent color filters and that adjacent color filters do not overlap with each other, thereby achieving the objective described above.

A forming method for a color filter according to the present invention includes: a color filter patterning step of patterning the color filters in such a manner that a predetermined interval is formed between adjacent color filter materials of different colors; and a color filter forming step of heat treating and fluidizing the patterned color filter materials and further curing the color filter materials to form color filters of different colors, thereby achieving the objective described above.

Preferably, in a forming method for a color filter according to the present invention, the thickness of the color filter materials is set in such a manner that the predetermined interval is filled at the time of the heat treating by melting the color filter materials and that the color filter materials do not overlap with each other.

Still preferably, in a forming method for a color filter according to the present invention, the color filter material is melted by the heat treating and is widened by gravity along a substrate plane direction so as to fill the predetermined interval with the color filter materials.

A color filter is formed by the forming method for a color filter according to the present invention, thereby achieving the objective described above.

A liquid display apparatus has a color filter formed by the forming method for a color filter according to the present invention, the color filter being provided on one of the two substrates putting liquid crystal material in between, thereby achieving the objective described above.

An electric information device according to the present invention includes the solid-state image capturing device manufactured by the manufacturing method for a solid-state image capturing device according to the present invention, as an image input device equipped in an image capturing section, thereby achieving the objective described above.

An electric information device according to the present invention has the liquid crystal display apparatus according to the present invention in a display section, thereby achieving the objective described above.

The functions of the present invention having the structures described above will be described hereinafter.

According to the present invention, color filter material is patterned on a semiconductor substrate in such a manner that a predetermined interval is formed in between adjacent color filter materials of different colors, heat treatment is performed on the color filter material to fluidize it, and further, the color filter material is cured. At the time of the patterning, the interval between the color filter materials is set, taking the characteristics of the color filter materials and the melting amount of the color filter materials at the heat treatment into consideration, so that there will be no gap after melting. Further, considering the amount of the position shifting due to the alignment accuracy, the interval is set such that the color filters will not overlap with each other after melting. With the method as described above, the color filters are formed in such a manner that the gap in between the color filters is filled, there is no gap between adjacent color filters, and further, the adjacent color filters do not overlap with each other in the end portions. As a result, a solid-state image capturing device with an excellent light separation characteristics is manufactured.

As described above, according to the present invention, in forming the color filters above the corresponding light receiving sections provided on the semiconductor substrate, the gaps between adjacent color filters are filled and the adjacent color filters do not overlap with each other. Therefore, it is achievable to manufacture a solid-state image capturing device having excellent light separation characteristics. Further, the color filter material used for the present invention does not have to be a material having high resolution or high sensitivity characteristic that requires improvement on micromachining technology as the cell size is reduced. Further, because the color filter material is melted and fluidized by heat treatment, the material can be processed with an equipment that only has alignment accuracy of one previous generation. Further, there is no need of processing a base interlayer insulation film in order to compensate for processing accuracy for the color filter. As a result, a man hour and manufacturing cost for the solid-state image capturing device can be significantly reduced.

These and other advantages of the present invention will become apparent to those skilled in the art upon reading and understanding the following detailed description with reference to the accompanying figures.

Figure 1:
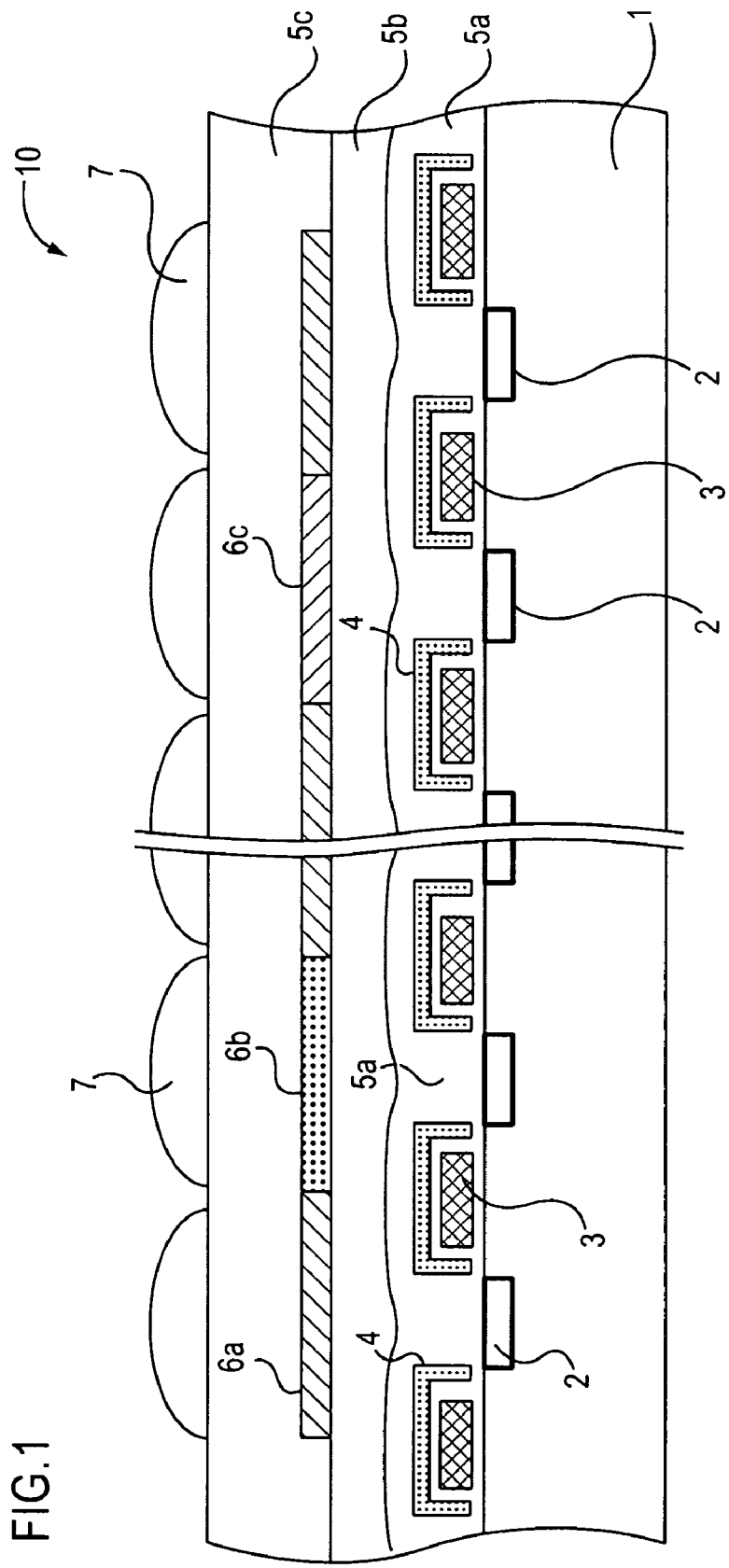
FIG. 1 is a longitudinal cross sectional view showing an exemplary essential structure of a CCD image sensor related to one embodiment of the solid-state image capturing device according to the present invention.

1 semiconductor substrate
2 light receiving section (photodiode)
3 polysilicon gate film (gate electrode film)
4 shading film
5a, 5b, 5c interlayer insulation film
6a', 6b', 6c' color filter before heat treatment (patterned color filter material)
6a, 6b, 6c color filter after heat treatment
7 microlens
10 CCD image sensor
10A CMOS image sensor
90 electronic information device
91 solid-state image capturing apparatus
92 memory section
93 display section
93a liquid crystal display apparatus
94 communication section
95 image output section

DESCRIPTION OF THE PREFERRED EMBODIMENTS

Hereinafter, a case where an embodiment of the manufacturing method of the solid-state image capturing device according to the present invention is applied for a CCD image sensor, will be described in detail with reference to accompanying figures. Note that the manufacturing method of the solid-state image capturing device according to the present invention is applicable to not only a CCD image sensor, but a CMOS image sensor.

FIG. 1 is a longitudinal cross sectional view showing an exemplary essential structure of a CCD image sensor related to the embodiment of the solid-state image capturing device according to the present invention.

In FIG. 1, a CCD image sensor 10 according to the embodiment includes a plurality of light receiving sections 2 formed in a matrix on a surface layer of a semiconductor substrate 1. The light receiving sections 2 are formed of a plurality of photodiodes that perform photoelectric conversion on incident light. On the semiconductor substrate 1, a polysilicon gate film 3 (gate electrode film) is formed for reading out and transferring signal charges, which are photoelectrically converted by each light receiving section 2. Further, a shading film 4, which is made of tungsten, aluminum and the like, is formed on the gate film 3 via an interlayer insulation film, so that light does not enter the substrate area other than each light receiving section 2, that is, such as the gate film 3. The shading film 4 is formed in such a manner to avoid being formed over each light receiving section 2. An interlayer insulation film 5a is formed on the semiconductor substrate 1 having the light receiving sections 2 and the shading film 4 formed thereon, for the purpose of electrical insulation.

On the interlayer insulation film 5a, an interlayer insulation film 5b is further formed so that unevenness resulted from a base shape formed on the interlayer insulation film 5a is improved and color filters are formable on the planarized surface. The insulation film 5b is composed of a transparent acrylic material and the like in order to improve adhesiveness to the color filters and improve optical transmittance. In recent years, there is such a case where an inner microlens (inner-layer microlens) is provided between the upper interlayer insulation film 5a and the lower interlayer insulation film 5b for the purpose of improving condensing efficiency by the microlens 7.

On the planarized interlayer insulation film 5b, a plurality of color filters 6a, 6b and 6c are formed in a corresponding manner to respective light receiving sections 2 in order to optically separate incident light. The color filters 6a, 6b and 6c are of different colors. In a case of FIG. 1, the color filters 6a, 6b and 6c are formed with primary color filters of green (G; green color), blue (B; blue color) and red (R; red color) respectively. The color filters 6a, 6b and 6c for the respective colors form Bayer array, where the green color filters 6a are alternately arranged checkerwise.

On the color filters 6a, 6b and 6c, an interlayer insulation film 5c is formed for the purpose of protecting the color filters 6a, 6b and 6c and planarizing above the surfaces of the color filters 6a, 6b and 6c prior to forming microlenses 7. On the interlayer insulation film 5c, microlenses 7 are formed in a corresponding manner with respective light receiving section 2 for the purpose of refracting incident light and condensing light that enters the shading film 4, which forms ineffective areas, into the light receiving section 2. Due to the condensing of light by the microlenses 7, the amount of light that enters the light receiving section 2 increases, improving the light receiving sensitivity.

With the structure described above, a manufacturing method of the CCD image sensor 10 according to the embodiment of the present invention will be described hereinafter in detail with reference to FIGS. 2 to 7.

Figure 2:
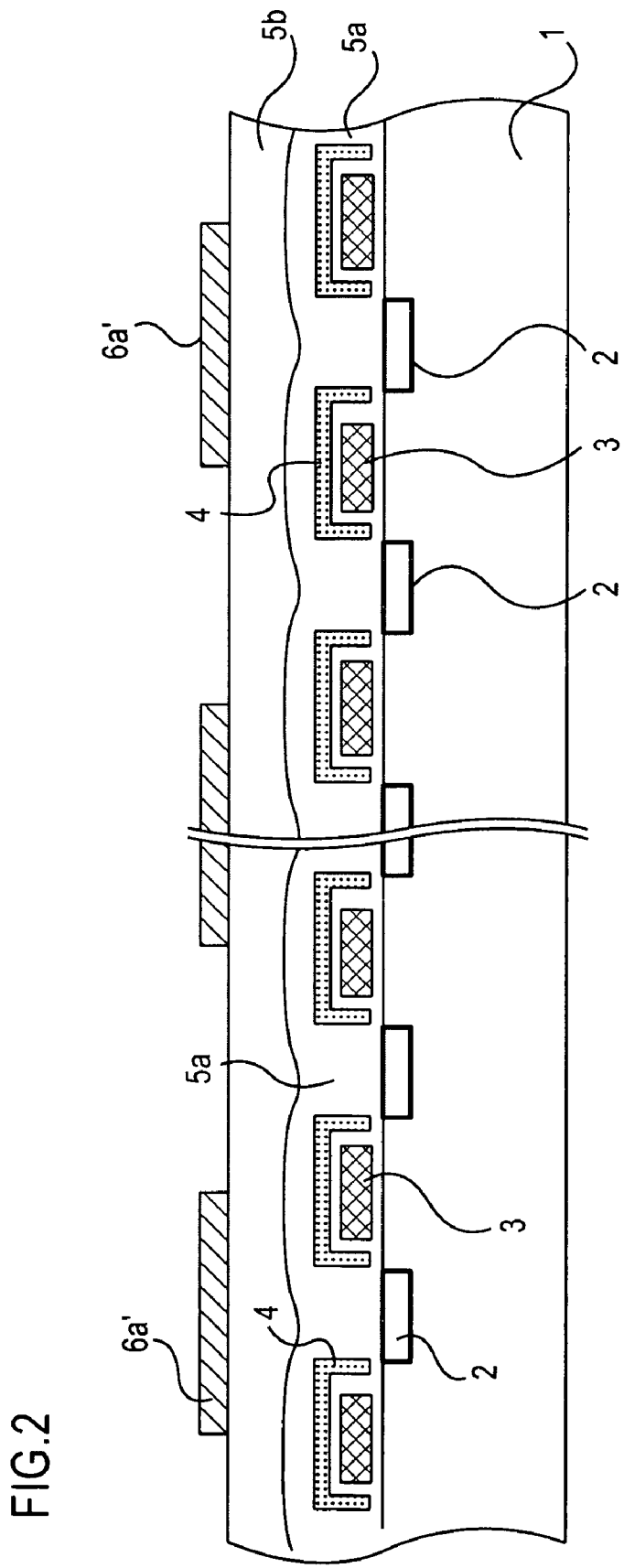
FIG. 2 is a longitudinal cross sectional view of an essential portion of a CCD image sensor for explaining a patterning step for a color filter 6a' before heat treatment in a manufacturing method for a CCD image sensor according to one embodiment of the present invention.
Figure 3:
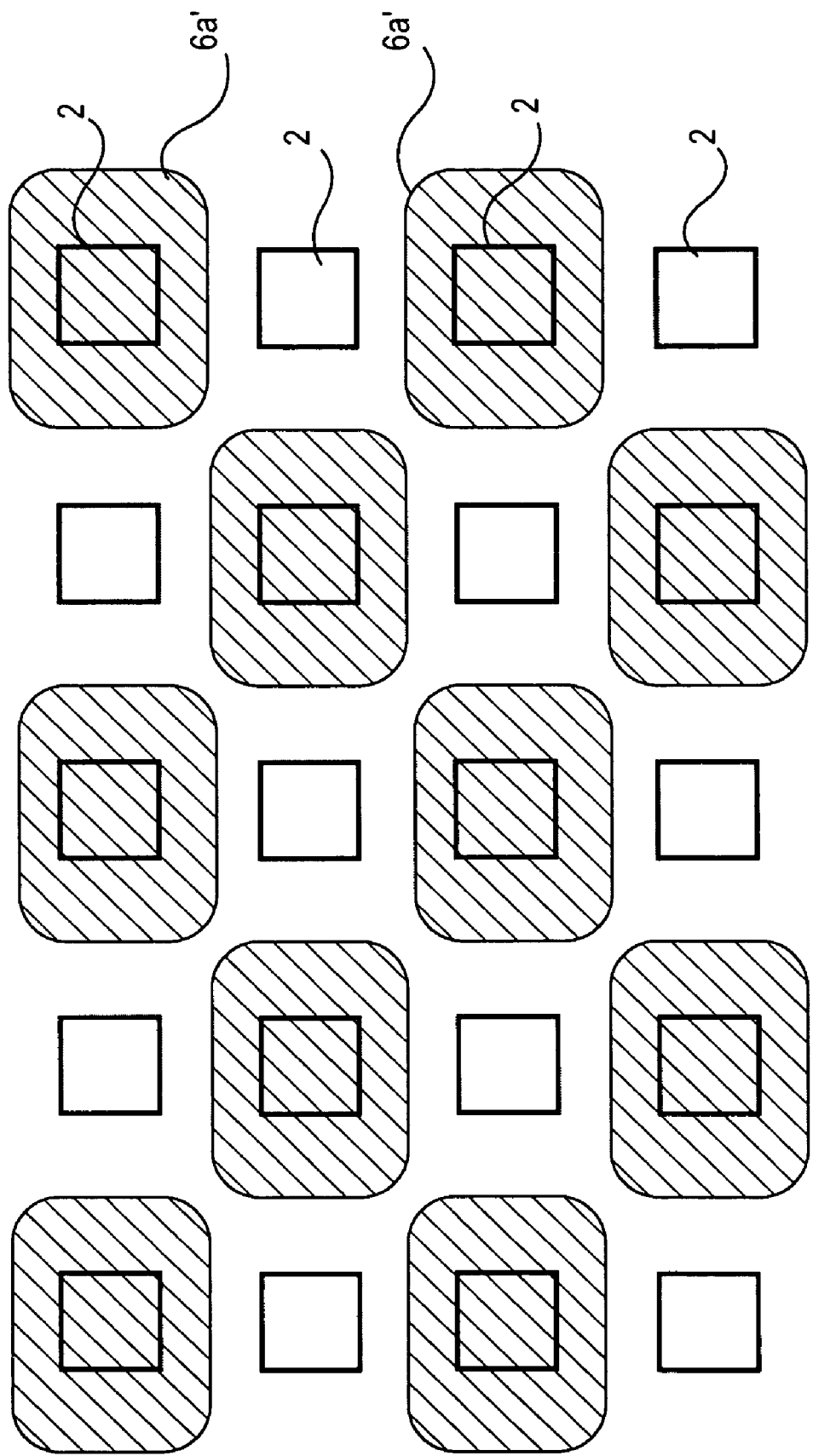
FIG. 3 is a plan view of an essential portion of a CCD image sensor for explaining a patterning step for a color filter 6a' before heat treatment in a manufacturing method for a CCD image sensor according to one embodiment of the present invention.
Figure 4:
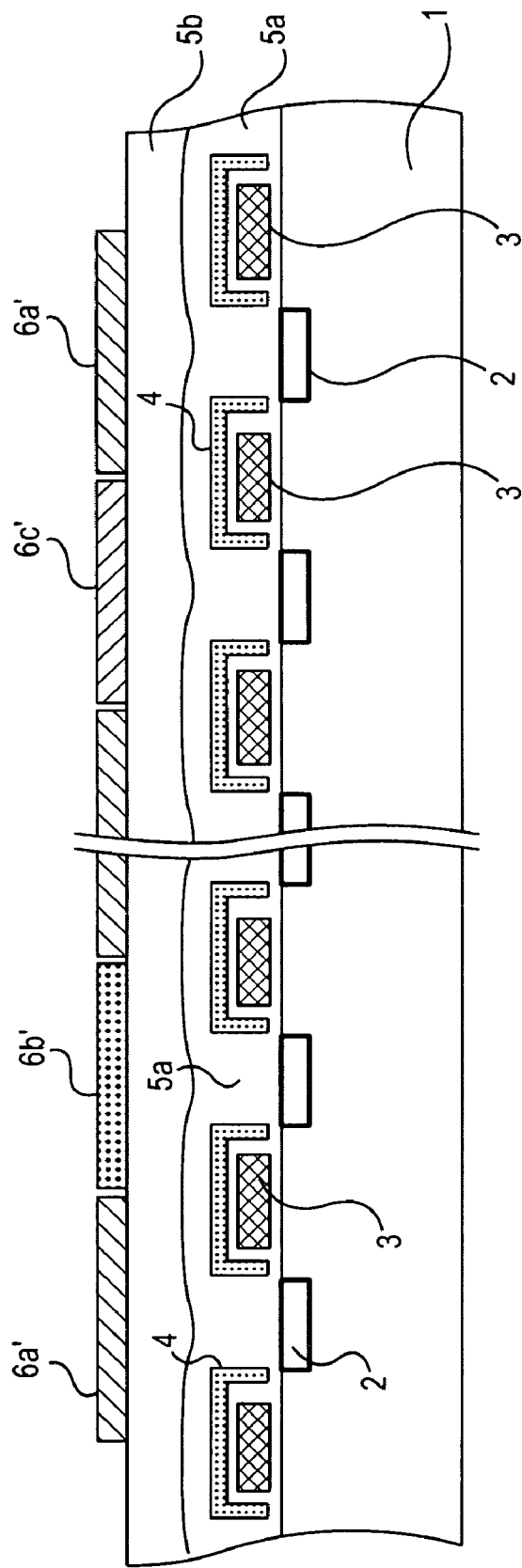
FIG. 4 is a longitudinal cross sectional view of an essential portion of a CCD image sensor for explaining a patterning step for color filters 6b' and 6c' before heat treatment in a manufacturing method for a CCD image sensor according to one embodiment of the present invention.
Figure 5:
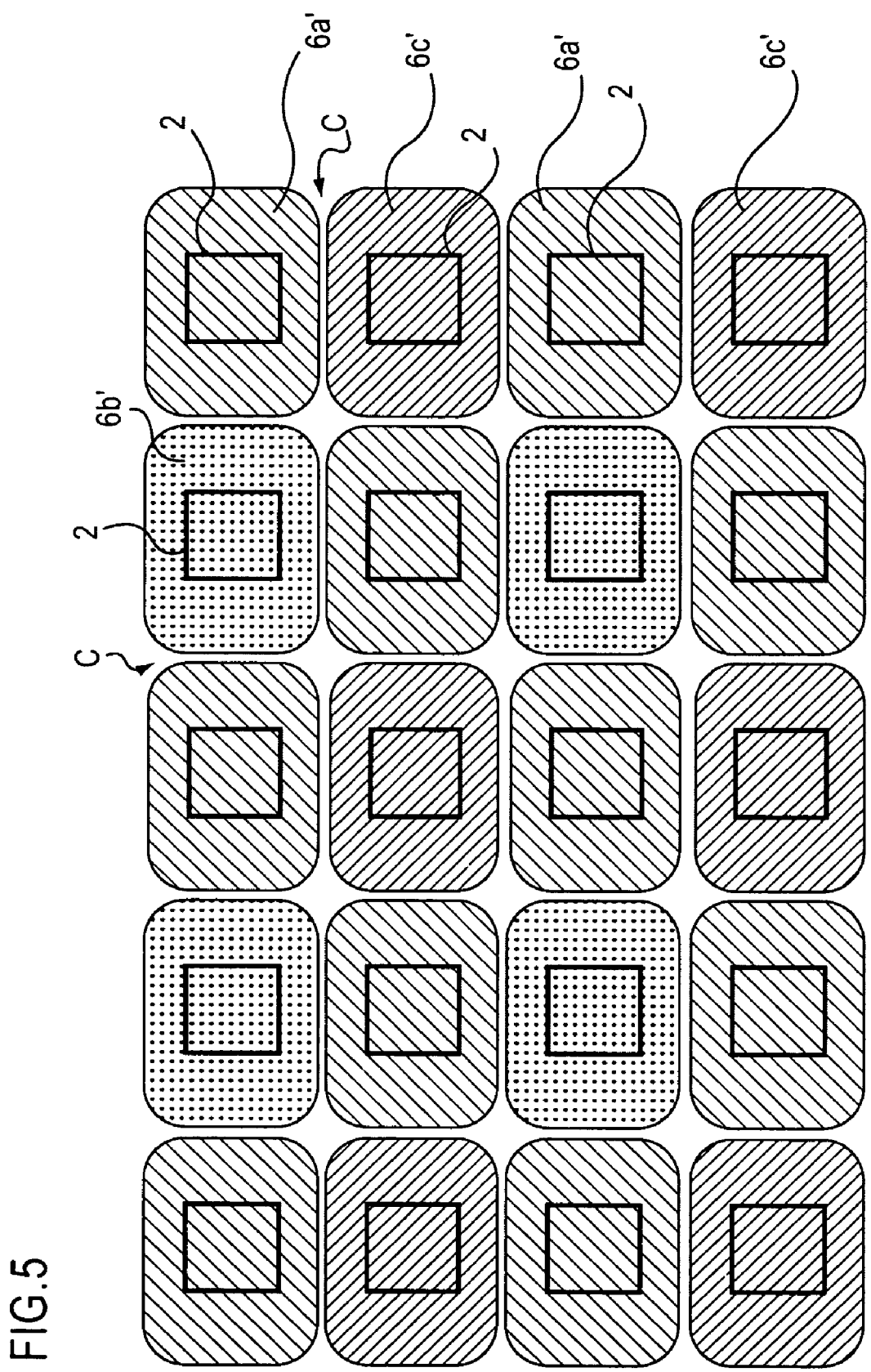
FIG. 5 is a plan view of an essential portion of a CCD image sensor for explaining a patterning step for color filters 6b' and 6c' before heat treatment in a manufacturing method for a CCD image sensor according to one embodiment of the present invention.
Figure 6:
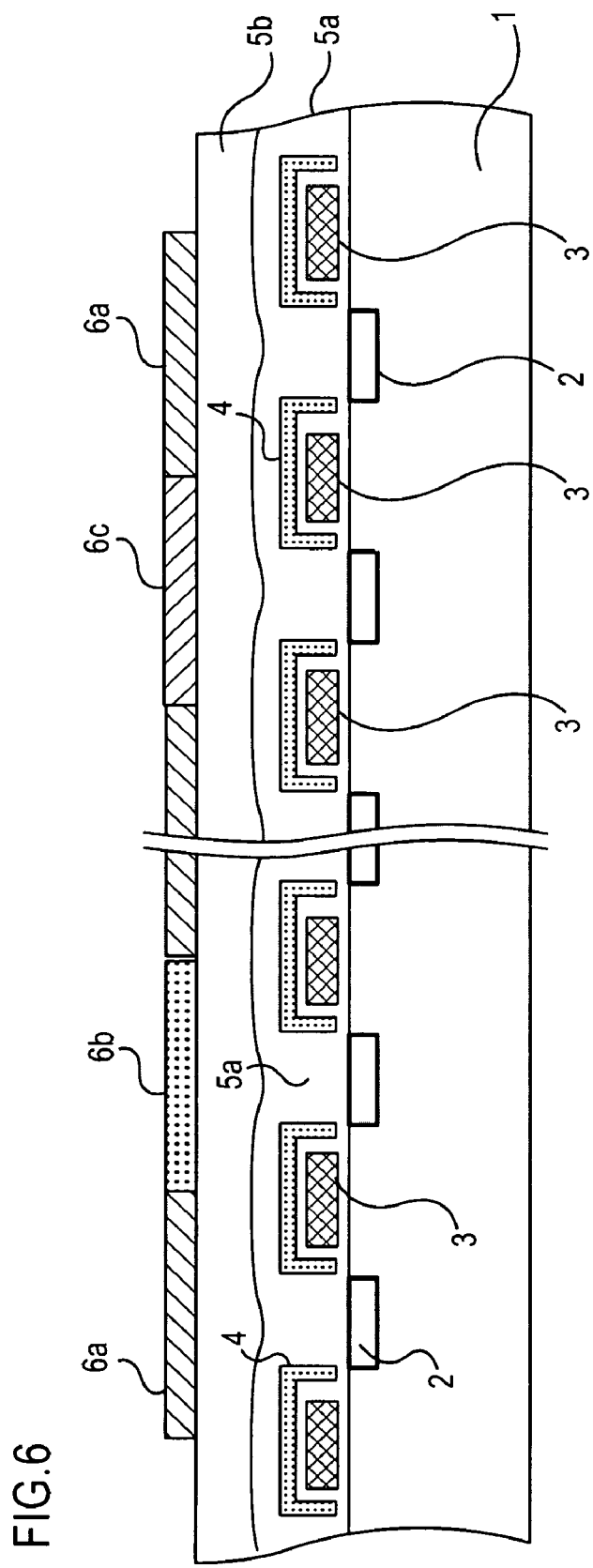
FIG. 6 is a longitudinal cross sectional view of an essential portion of a CCD image sensor for explaining a forming step for color filters 6a', 6b' and 6c' after heat treatment in a manufacturing method for a CCD image sensor according to one embodiment of the present invention.
Figure 7:
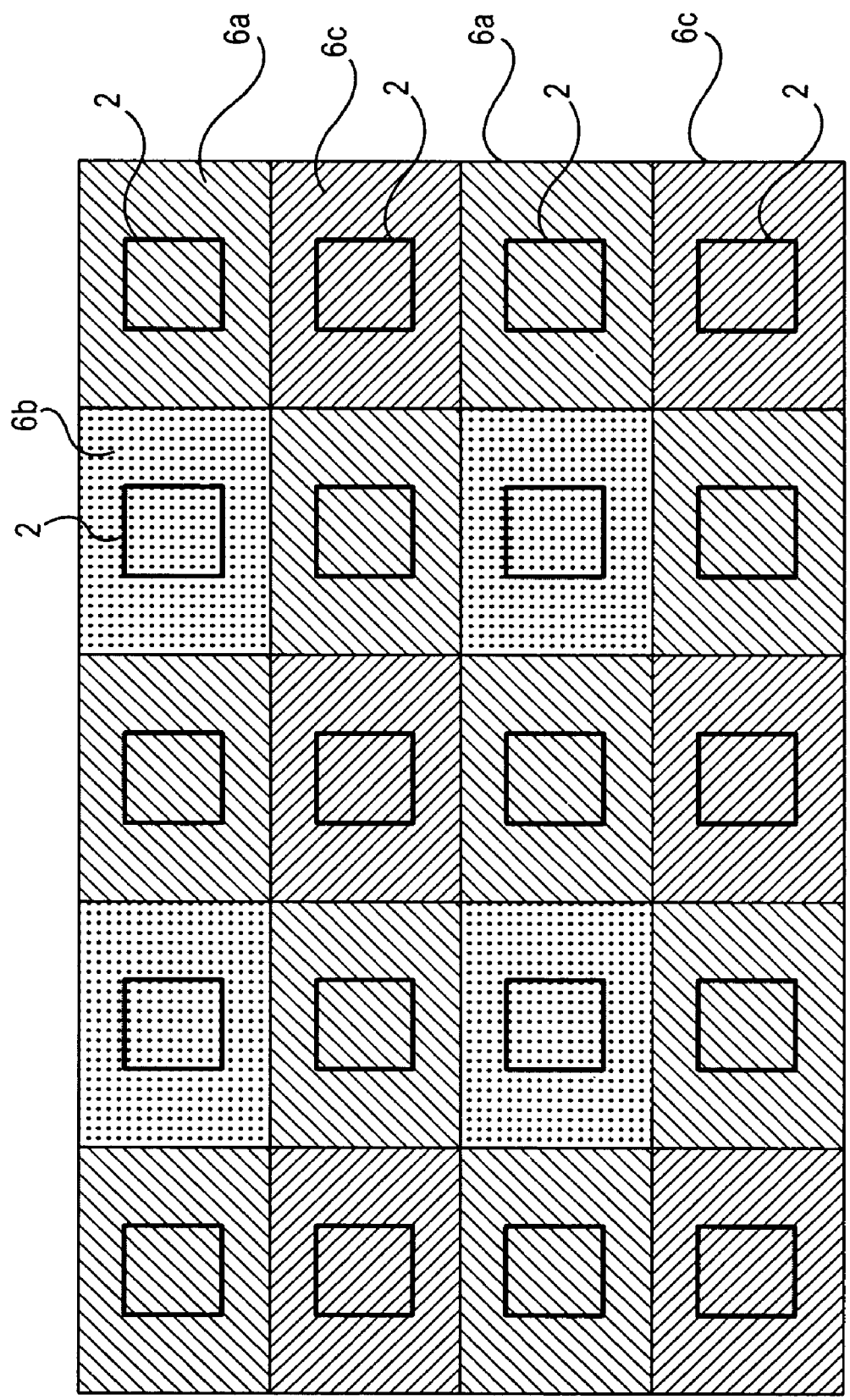
FIG. 7 is a plan view of an essential portion of a CCD image sensor for explaining a forming step for color filters 6a', 6b' and 6c' after heat treatment in a manufacturing method for a CCD image sensor according to one embodiment of the present invention.
Figure 8:
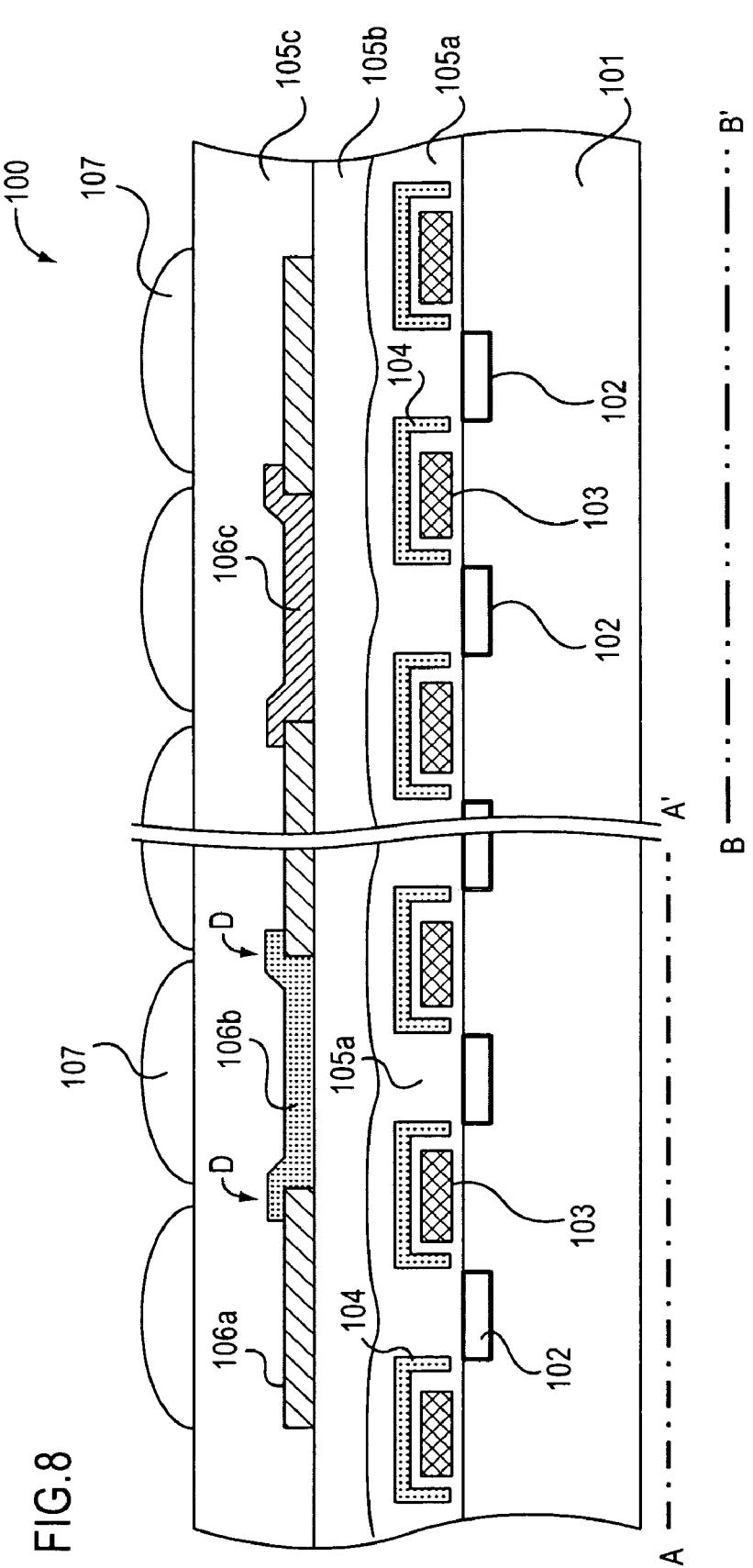
FIG. 8 is a longitudinal cross sectional view showing an exemplary essential structure of a conventional solid-state image capturing device.
Figure 9:
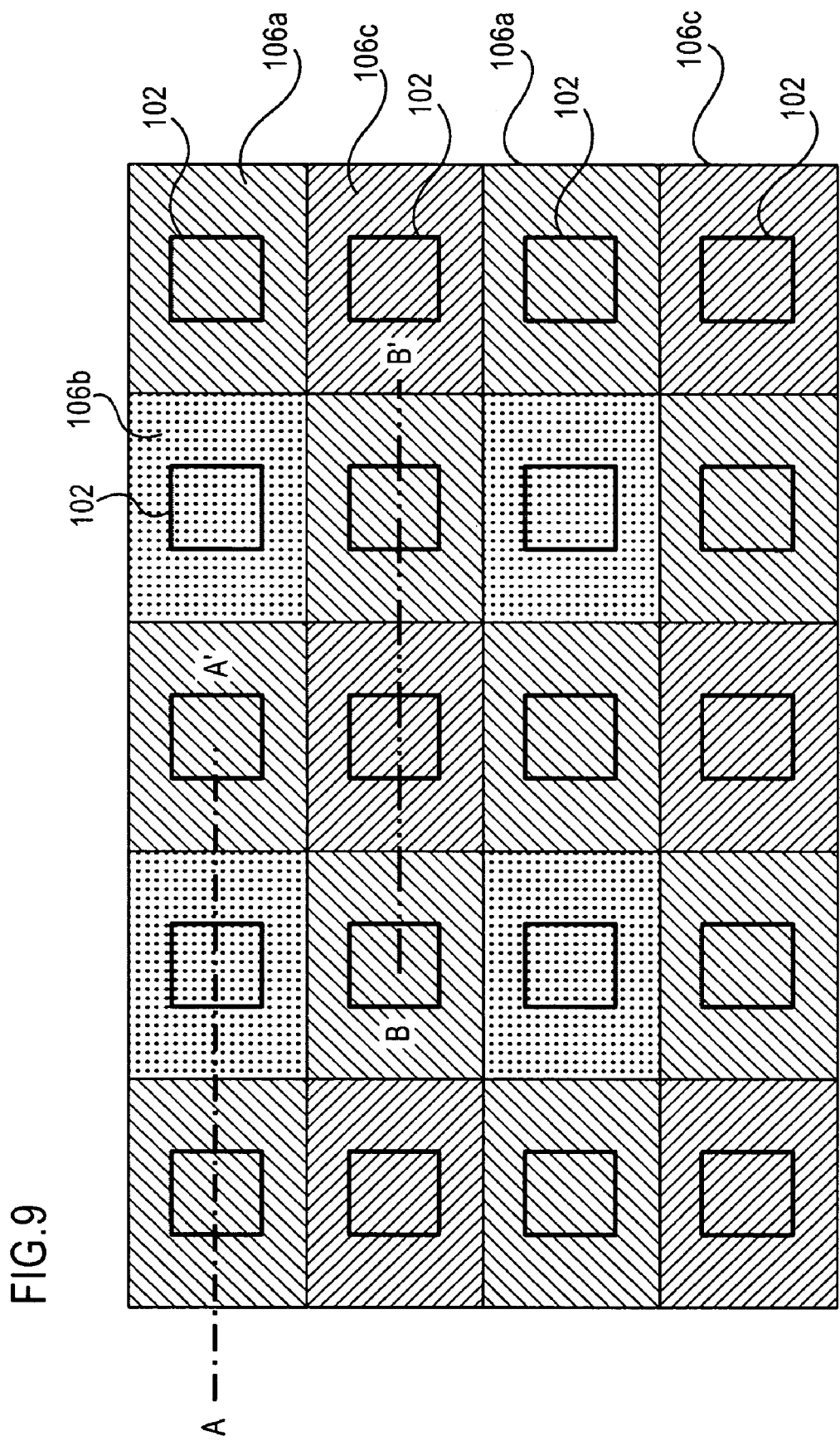
FIG. 9 is a plan view of an essential portion of color filters for hypothetically showing a desirable forming state of color filters together with light receiving sections in the solid-state image capturing device in FIG. 8.
Figure 10:
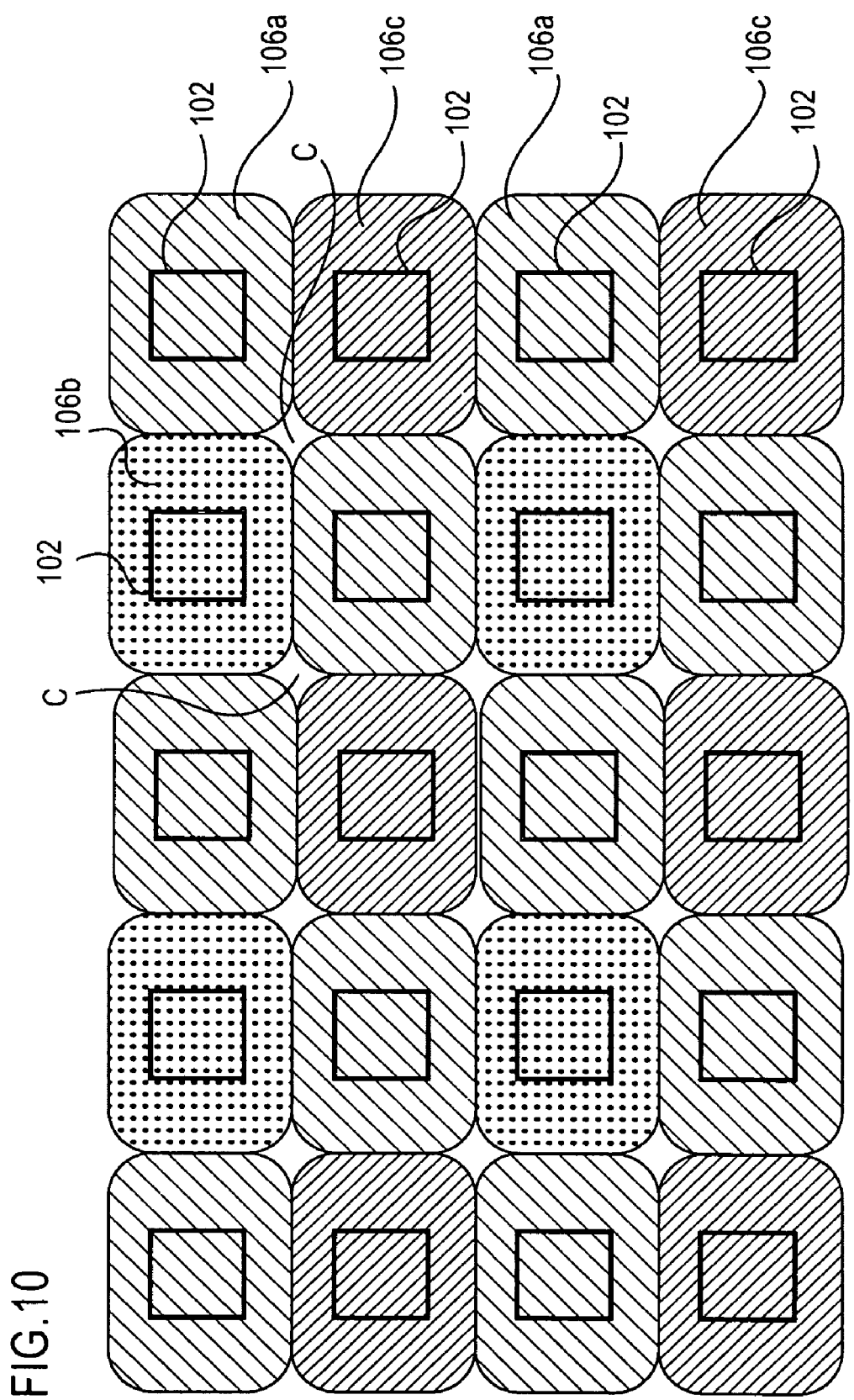
FIG. 10 is a plan view of an essential portion of color filters for showing actual forming state of color filters together with light receiving sections in the solid-state image capturing device in FIG. 8.

FIGS. 2, 4 and 6 are longitudinal cross sectional views for successively explaining color filter forming steps (1 to 3) respectively with respect to the manufacturing method of the CCD image sensor 10 of the embodiment. FIGS. 3, 5 and 7 are plan views corresponding to respective steps of FIGS. 2, 4 and 6. Since forming steps of the light receiving section 2, the gate film 3, the shading film 4, the interlayer insulation films 5a to 5c and the microlens 7 are the same as those in the manufacturing method of a conventionally used solid-state image capturing device, the explanation for such steps will be omitted herein, and the forming steps of the color filters 6a, 6b and 6c only will be explained.

As shown in a patterning step (1) of a color filter 6a' in FIGS. 2 and 3, the interlayer insulation film 5b is planarized, and subsequently, color filter material is patterned to form the color filters 6a' that have not yet been heat treated. First, a photosensitive color filter material is applied on the interlayer insulation film 5b up to a desired thickness (about 0.5 μm, for example) by a spin coating method and the like. The applied color filter material is exposed by an exposing device so that a pattern will be left only on a desired island area (checkerwise) corresponding to the position of the light receiving section 2 in such a manner that the pattern is left on every other area (light receiving area). A developing process using a developing solution is performed to pattern a predetermined form (island from and checkerwise form in FIG. 3).

Further, in order to secure reliability, a heat bridge agent, such as epoxy compounds and melanin resin, may be added to the color filter material. For example, greater than or equal to 0.1 wt percent (percent by weight) and less than or equal to 2.0 wt percent (percent by weight) of both of epoxy compounds and melanin resin can be added to the color filter material. Both of the epoxy compounds and melanin resin are used. The melanin resin is the primary heat bridge agent. Although the epoxy compounds also serve for bridge, the bridge speed can be controlled by the epoxy compounds. Such a mixture of the epoxy compounds and the melanin resin enables itself to be melted by heat and then cured.

As described above, the heat bridge agent is added to the color filter material and the color filter material is melted by heating to form a desired form. Subsequently, the color filter material is bridged not to be affected by a post-process such as heat treatment.

This state is shown as a cross sectional view in FIG. 2 and as a top view in FIG. 3.

Next, as shown in a patterning step (2) for a color filters 6b' and 6c' in FIGS. 4 and 5 respectively, the color filter 6b' is formed on the interlayer insulation film 5b by patterning the color filter material, and further, the color filter 6c' is formed by patterning the color filter material.

The color filter 6b', whose color is different from that of the color filter 6a', is patterned similarly to the case for the color filter 6a'. At this point, the color filter 6b' is patterned such that a predetermined interval is created between the color filter 6b' and the color filter 6a' of a different color. The interval between the color filter 6a' and the color filter 6b' is set to be an interval C, taking the characteristics of the color filter materials, the melting amount of the color filter materials during the heat treatment, and the least amount of the materials needed in order not to have an interval (gap C) after melting into consideration, so that there will be no gap after melting. Further, considering the amount of the position shifting due to the alignment accuracy, the interval (gap C) is set such that the color filter 6a and the color filter 6b will not overlap with each other after melting.

For example, it is preferable to set the interval between the color filter 6a' and the color filter 6b' in the range of greater than or equal to 0.1 μm and less than or equal to 0.2 μm (or greater than 0.1 μm and less than or equal to 0.2 μm). If the interval between the color filter materials is smaller than 0.1 μm, the alignment accuracy will be less than 0.07 μm to 0.09 μm and the color filter materials will overlap with each other before melting. In addition, if the interval between the color filter materials is greater than 0.2 μm, the interval between the color filter materials will not be filled after melting.

Subsequently, the color filter 6c', whose color is different from those of the color filter 6a' and the color filter 6b', is patterned. At this point, the interval between the color filter materials is set similarly to the positional relationship between the color filter 6a' and the color filter 6b'. This state is shown as a cross sectional view in FIG. 4 and as a top view in FIG. 5.

A material having properties of melting by heat treatment and extending in a transverse direction by gravity is used as the color filter material. For example, a pigment or dye is added to polystyrene resin, which has a low melting point, as the color filter material, resulting in the color filter material having both characteristics to be a color filter and photosensitivity function.

A resist material including greater than or equal to 1 wt percent and less than or equal to 10 wt percent (percent by weight) of polyhydroxy styrene, for example, is used as the polystyrene resin described above. In addition, greater than or equal to 1.5 wt percent and less than or equal to 3.5 wt percent of C. I. Pigment yellow 150 (color filter number) or C. I. Pigment yellow 138 (color filter number) and greater than or equal to 6.0 wt percent and less than or equal to 8.0 wt percent of C. I. Pigment green 7 (color filter number) or C. I. Pigment green 36 (color filter number) mixed with each other is used as the pigment, and a material including the pigment is used for the green color filter. Further, greater than or equal to 5.0 wt percent and less than or equal to 10.0 wt percent of C. I. Pigment red 254 (color filter number) is used as the pigment, and a material including the pigment is used for the red color filter. Further, greater than or equal to 4.0 wt percent and less than or equal to 8.0 wt percent of copper phthalocyanine blue having α, β, or ε crystalline form is used as the pigment, and a material including the pigment is used for the blue color filter. The color filter numbers are standardized numbers used for color materials of pigments, which define respective colors with their own transmissivities.

Next, as shown in a forming step (3) of the color filters 6a, 6b and 6c in FIGS. 6 and 7, a heat treatment is performed for four minutes at 160 degrees Celsius using a hot plate, for example, so as to melt and fluidize the color filters 6a, 6b and 6c. As a result, gaps C in between the color filters 6a, 6b and 6c are completely filled, so that the color filters 6a, 6b and 6c that have no gaps are formed, and they are melted, fluidized and then cured.

This state is shown as a cross sectional view in FIG. 6 and as a top view in FIG. 7. In this case, the color filter material is cured by heat bridge.

With the structure above, according to the embodiment of the present invention, the interval between the color filters is set to be an interval, taking the characteristic of the color filter materials and the melting amount of the color filter materials at the heat treatment into consideration, so that there will be no gap after melting. Further, considering the amount of the position shifting due to the alignment accuracy, the interval C is set such that the end portions of the color filter 6a, 6b and 6c will not overlap with one another after melting. As described above, the color filters 6a, 6b and 6c are patterned on the semiconductor substrate 1 such that a predetermined interval C is set between the adjacent color filters of different colors. The color filters 6a, 6b and 6c are then heat treated to fluidize and cure them. As a result, there is no need to improve the resolution or light receiving sensitivity of the color filter material or there is no need to process the base film, and the gap C or the overlapping portion D between the adjacent color filters 6a, 6b and 6c can be eliminated, which enables the color filters 6a, 6b and 6c having excellent light separation characteristics to be formed. Accordingly, the light receiving sensitivity characteristics of the light receiving sections 2 can be improved.

Although the case where the color filters 6a, 6b and 6c of three primary colors (R, G, B) are provided has been described in the embodiment described above, this does not necessarily have to be the only case. The colors can also be four colors of three complementary colors (yellow, cyan, and magenta) and green, which is a primary color, besides the three primary colors (R, G, B). If signal processing methods or devices are different, any number of colors, (e.g., four or more colors) can be set.

Further, although all the color filter materials are patterned and they are then melted by heat treatment in the embodiment described above, the color filter materials may be melted by heat treatment in the middle of patterning the plurality of color filter materials in accordance with the interval between the color filter materials and the abilities of the color filter materials.

More specifically, the heat treatment can be performed on the color filter materials either individually for each color after the patterning of the color filter materials, or simultaneously for a plurality of colors after the patterning of the plurality of color filter materials, or simultaneously for two colors of the plurality of the colors. For example, when the heat treatment is performed individually for each color, the color filter materials can be melted and expanded up to a predetermined color filter area, and a predetermined interval C between this color filter material and an adjacent color filter material can be completely filled. In addition, when the heat treatment is performed simultaneously for the plurality of colors (three colors herein) as described above (or it may be two colors of the plurality of colors), all the color filter materials of a plurality of colors (three colors herein) can be simultaneously melted by heat treatment, and the area of the color filters can be expanded until the predetermined interval C is completely filled with the color filter materials.

Further, although the heat treatment is performed at 160 degrees Celsius for four minutes in the embodiment described above, the heat treatment does not necessarily have to be performed thus. The heat treatment may be performed in the temperature range of 150 degrees Celsius to 165 degrees Celsius for two to five minutes. If the temperature is lower than 150 degrees Celsius and the heating time is as short as two minutes, it is difficult for the color filter material to fluidize. If the temperature exceeds 165 degrees Celsius and the heating time exceeds five minutes, it may influence the color filter material in an undesired way.

Further, although the manufacturing method for the solid-state image capturing device has been described in the embodiment described above, the method does not necessarily have to be for the solid-state image capturing device. A forming method for the color filter used for the manufacturing method of the solid-state image capturing device may also be applied to a manufacturing method for a liquid crystal display apparatus, which has color filters formed by the forming method for the color filter and provided on one of the two substrates putting liquid crystal material inbetween. In such a case, a forming method for a color filter may include a color filter patterning step of patterning a color filter in such a manner that a predetermined interval is formed between adjacent color filter materials of different colors; and a color filter forming step of heat treating and fluidizing the patterned color filter material and further curing the color filter material to form a color filter of each color.

Further, although not explained in the embodiment described above, an electronic information device will be described hereinafter. The electronic information device, such as a digital camera (e.g., digital video camera and digital still camera), an image input camera (e.g., monitoring camera, a door intercom camera, a car-mounted camera, a camera for television telephone and a camera for cell phone), a scanner, a facsimile machine and a camera-equipped cell phone device, has an image capturing section equipped with the CCD image sensor 10 or a CMOS image sensor 10A, for which the manufacturing method for the solid-state image capturing device according to the present invention is applied, according to the embodiment of the present invention described above as an image input device.

Figure 11:
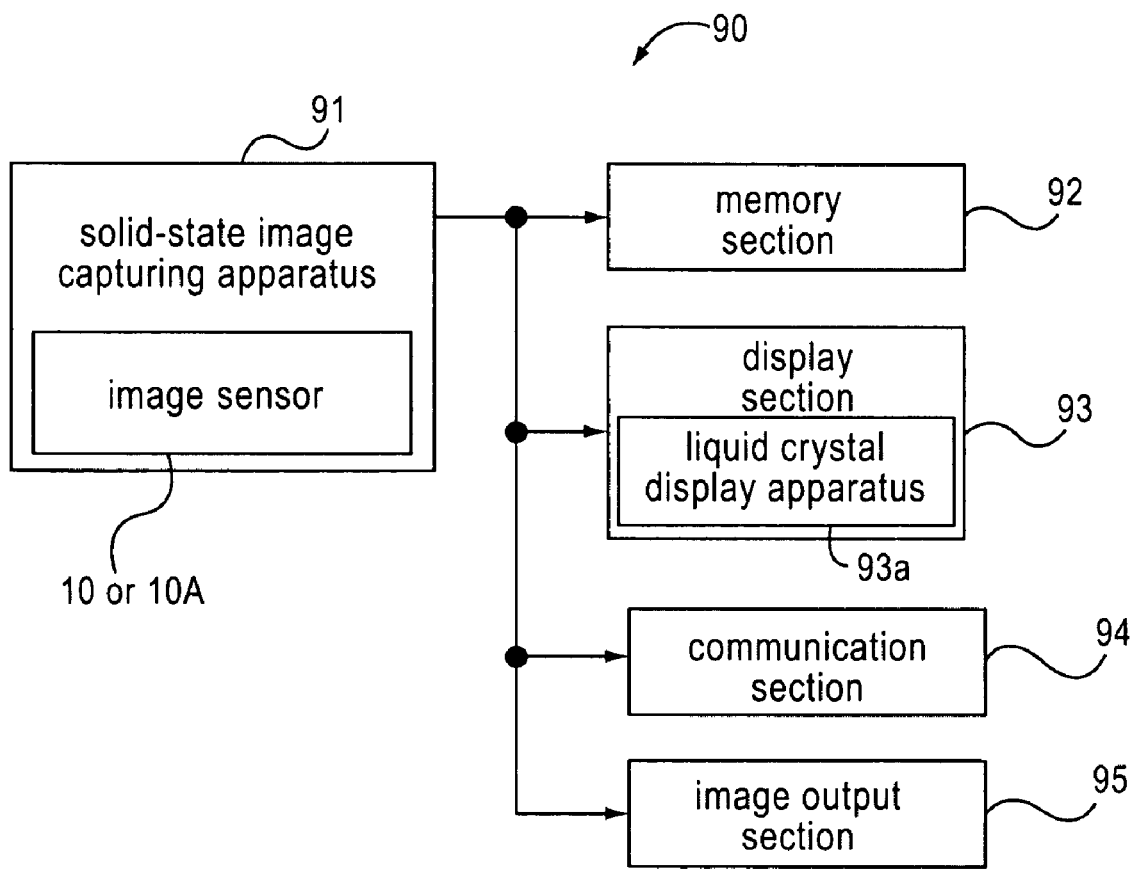
FIG. 11 is a block diagram showing an exemplary diagrammatic structure of an electronic information device including the solid-state image capturing apparatus including the CCD image sensor according to the embodiment of the present invention or the CMOS image sensor for which the manufacturing method for the solid-state image capturing device according to the present invention is applied, in an image capturing section.

FIG. 11 is a block diagram showing an exemplary diagrammatic structure of an electronic information device including the solid-state image capturing apparatus including the CCD image sensor 10 according to the embodiment of the present invention or the CMOS image sensor 10A for which the manufacturing method for the solid-state image capturing device according to the present invention is applied, in an image capturing section.

In FIG. 11, the electronic information device 90 according to the present invention includes a solid-state image capturing apparatus 91 for performing a variety of signal processing on an image capturing signal from the image sensor 10 according to the embodiment or the CMOS image sensor 10A, for which the manufacturing method for the solid-state image capturing device according to the present invention is applied, so that high-quality color image data can be obtained. Further, the electronic information device 90 includes: a memory section 92 (e.g., recording media) for data-recording a high-quality color image data obtained by the solid-state image capturing apparatus 91 after a predetermined signal process is performed on the image data for recording; a display section 93 (e.g., liquid crystal display device) for displaying this color image data from the solid-state image capturing apparatus 91 on a display screen (e.g., liquid crystal display screen) after a predetermined signal process is performed for display; a communication section 94 (e.g., transmitting and receiving device) for communicating this color image data from the solid-state image capturing apparatus 91 after a predetermined signal process is performed on the image data for communication; and an image output section 95 for printing (typing out) and outputting (printing out) this color image data from the solid-state image capturing apparatus 91. Further, the electronic information device 90 may also include at least any of: the memory section 92, the display section 93, the communication section 94, and the image output section 95 (e.g., a printer), other than the solid-state image capturing apparatus 91. In addition, a liquid crystal display apparatus, which has color filters formed by the forming method for the color filter and provided on one of the two substrates putting liquid crystal material in between, can be applied to the display section 93. Further, other than the electronic information device 90, an electronic information device having a liquid crystal display apparatus, which has color filters formed by the forming method for the color filter and provided on one of the two substrates putting liquid crystal material in between, can be considered.

Therefore, according to the embodiments other than the ones described above, based on color image signals from the solid-state image capturing apparatus 91, the electronic information device 90 of the present invention is capable of displaying the color image signals on a display screen finely, printing out (outputting) the color image signals finely by an image output section 95, communicating the color image signals finely as communication data via wire or radio, storing the color image signals finely by performing a predetermined data compression process on the memory section 92, and performing various data processes finely.

As described above, the present invention is exemplified by the use of its preferred embodiment. However, the present invention should not be interpreted solely based on the embodiment described above. It is understood that the scope of the present invention should be interpreted solely based on the claims. It is also understood that those skilled in the art can implement equivalent scope of technology, based on the description of the present invention and common knowledge from the description of the detailed preferred embodiment of the present invention. Furthermore, it is understood that any patent, any patent application and any references cited in the present specification should be incorporated by reference in the present specification in the same manner as the contents are specifically described therein.

INDUSTRIAL APPLICABILITY

The present invention can be applied to the field of a solid-state image capturing device having a color filter provided above each light receiving section provided on a surface of a semiconductor substrate, and configured with semiconductor elements for performing photoelectric conversion on image light from a subject to capture an image light; the manufacturing method of the solid-state image capturing device; and an electronic information device, such as a digital camera (e.g., digital video camera and digital still camera), an image input camera, a scanner, a facsimile machine and a camera-equipped cell phone device, having the solid-state image capturing device as an image input device in an image capturing section of the electronic information device. In forming the color filters above the corresponding light receiving sections provided on the semiconductor substrate, the gaps between adjacent color filters are filled and the adjacent color filters do not overlap with each other. Therefore, it is achievable to manufacture a solid-state image capturing device having excellent light separation characteristics. Further, the color filter material used for the present invention does not have to be a material having high resolution or high sensitivity characteristic that requires improvement on micromachining technology as the cell size is reduced. Further, because the color filter material is melted and fluidized by heat treatment, the material can be processed with an equipment that only has alignment accuracy of one previous generation. Further, there is no need of processing a base interlayer insulation film in order to compensate for processing accuracy for the color filter. As a result, a man hour and manufacturing cost for the solid-state image capturing device can be significantly reduced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A manufacturing method for a solid-state image capturing device having a plurality of light receiving sections for performing photoelectric conversion on incident light, provided on a surface side of a semiconductor substrate; and color filters of different colors for optically separating the incident light, provided above the plurality of corresponding light receiving sections comprising:
   a color filter patterning step of patterning the color filters in such a manner that a predetermined interval is formed between adjacent color filter materials of different colors; and
   a color filter forming step of heat treating and fluidizing the patterned color filter materials and further curing the color filter materials to form color filters of different colors,
   wherein the thickness of the color filter materials is set in such a manner that the predetermined interval is filled at the time of the heat treating by melting the color filter materials and that the color filter materials do not overlap with each other.

2. A manufacturing method for a solid-state image capturing device according to claim 1, wherein the color filter material is widened by gravity along a substrate plane direction so as to fill the predetermined interval with the color filter materials.

3. A manufacturing method for a solid-state image capturing device according to claim 1, wherein the color filter forming step performs the heat treating either individually for each color after patterning the color filter materials, or simultaneously for a plurality of colors after successively patterning the plurality of color filter materials of different colors, or simultaneously for two colors of the plurality of the colors.

4. A manufacturing method for a solid-state image capturing device according to claim 3, wherein, when the heat treating is performed individually for the each color, the color filter material is melted and widened up to a predetermined color filter area and the predetermined interval between the color filter material and an adjacent color filter material is completely filled.

5. A manufacturing method for a solid-state image capturing device according to claim 3, wherein, when the heat treating is performed either simultaneously for the plurality of colors or simultaneously for two colors of the plurality of colors, the color filter materials of the plurality of colors or the two colors are simultaneously melted by the heat, treating, and the color filter area is widened until the predetermined interval is completely filled with the color filter materials.

6. A manufacturing method for a solid-state image capturing device according to claim 1, wherein the heat treating is performed at between 150 degrees Celsius and 165 degrees Celsius for two to five minutes.

7. A manufacturing method for a solid-state image capturing device according to claim 1, wherein polystyrene resin added with a pigment or dye is used for one or more of the color filter materials.

8. A manufacturing method for a solid-state image capturing device according to claim 7, wherein the polystyrene resin includes a resist material including greater than or equal to 1 wt percent and less than or equal to 10 wt percent of polyhydroxy styrene.

9. A manufacturing method for a solid-state image capturing device according to claim 7, wherein greater than or equal to 1.5 wt percent and less than or equal to 3.5 wt percent of an yellow pigment and greater than or equal to 6.0 wt percent and less than or equal to 8.0 wt percent of a green pigment mixed with each other is used as the pigment and a material including the pigment is used for a green color filter; a material including greater than or equal to 5.0 wt percent and less than or equal to 10.0 wt percent of a red pigment is used for a red color filter ; and greater than or equal to 4.0 wt percent and less than or equal to 8.0 wt percent of copper phthalocyanine blue having $\alpha$, $\beta$, or $\epsilon$ crystalline form is used as the pigment, and a material including the pigment is used for a blue color filter.

10. A manufacturing method for a solid-state image capturing device according to claim 7, wherein a heat bridge agent for curing is added to the color filter material.

11. A manufacturing method for a solid-state image capturing device according to claim 10, wherein both of epoxy compounds and melanin resin are added as the heat bridge agent to the color filter material.

12. A manufacturing method for a solid-state image capturing device according to claim 10, wherein greater than or equal to 0.1 wt percent or and less than or equal to 2.0 wt percent of either the epoxy compounds or the melanin resin is added as the heat bridge agent.

13. A manufacturing method for a solid-state image capturing device according to claim 1, wherein, in the color filter patterning step, the predetermined interval is set so that there will be no gap after melting, due to the characteristic of the color filter materials and the melting amount of the color filter materials at the time of heat treating.

14. A manufacturing method for a solid-state image capturing device according to claim 1, wherein, in the color filter patterning step, the predetermined interval is set so that adjacent color filter materials will not overlap with each other by setting the amount of the position shifting due to the alignment accuracy to the limit value.

15. A manufacturing method for a solid-state image capturing device according to claim 13, wherein, in the color filter patterning step, the predetermined interval is set so that adjacent color filter materials will not overlap with each other by setting the amount of the position shifting due to the alignment accuracy to the limit value.

16. A manufacturing method for a solid-state image capturing device according to claim 1, wherein the predetermined interval is set greater than or equal to 0.1 µm and less than or equal to 0.2 µm in the color filter patterning step.

17. A manufacturing method for a solid-state image capturing device according to claim 1, wherein the color filter patterning step includes:
   a first color filter patterning step of applying a desired thickness of a photosensitive first color filter material on an interlayer insulation film provided on the semiconductor substrate, exposing the first color filter material by an exposing device so that a pattern will be left only on a desired area among areas corresponding to the plurality of light receiving sections, and performing a process using a developing solution on the first color filter-material to pattern a first color filter;
   a second color filter patterning step of applying a desired thickness of a photosensitive second color filter material on the interlayer insulation film, exposing the second color filter material by the exposing device so that a pattern will be left on another desired area different from the desired area among areas corresponding to the plurality of light receiving sections, and performing a process using a developing solution on the second color filter material to pattern a second color filter; and
   a third color filter patterning step of applying a desired thickness of a photosensitive third color filter material on the interlayer insulation film, exposing the third color filter material by the exposing device so that a pattern will be left on the rest of the area among areas corresponding to the plurality of light receiving sections, and performing a process using a developing solution on the third color filter material to pattern a third color filter.

18. A manufacturing method for a solid-state image capturing device according to claim 17, wherein the first color filter is a green color filter, the second color filter is either a red or blue color filter, and the third color filter is the other color of the red or blue color filter.

19. A manufacturing method for a solid-state image capturing device according to claim 1, wherein the color filters of different colors have either three primary colors of green, red and blue or four colors using complementary colors of yellow, magenta, and cyan, and green.

20. A manufacturing method for a solid-state image capturing device according to claim 1, wherein the color filters of different colors form Bayer array.

21. A solid-state image capturing device manufactured by the manufacturing method of the solid-state image capturing device according to claim 1, comprising a plurality of light receiving sections for performing photoelectric conversion on incident light, provided on a surface side of a semiconductor substrate; and color filters of different colors for optically separating the incident light, provided above the plurality of corresponding light receiving sections,
   wherein the color filters of different colors are formed in such a manner that there is no gap in between adjacent color filters and that adjacent color filters do not overlap with each other.

22. A forming method for a color filter, comprising:
   a color filter patterning step of patterning the color filters in such a manner that a predetermined interval is formed between adjacent color filter materials of different colors; and
   a color filter forming step of heat treating and fluidizing the patterned color filter materials and further curing the color filter materials to form color filters of different colors,
   wherein the thickness of the color filter materials is set in such a manner that the predetermined interval is filled at the time of the heat treating by melting the color filter materials and the color filter materials do not overlap with each other.

23. A forming method for a color filter according to claim 22, wherein the color filter material is widened by gravity along a substrate plane direction so as to fill the predetermined interval with the color filter materials.

24. A color filter formed by the forming method for a color filter according to claim 20.

25. A liquid display apparatus having a color filter formed by the forming method for a color filter according to claim 20, the color filter being provided on one of the two substrates putting liquid crystal material in between.

26. An electric information device including the solid-state image capturing device manufactured by the manufacturing method for a solid-state image capturing device according to claim 1, as an image input device equipped in an image capturing section.

27. An electric information device having the liquid crystal display apparatus according to claim 25 in a display section.

* * * * *